(12) United States Patent
McCollum

(10) Patent No.: US 11,758,681 B2
(45) Date of Patent: Sep. 12, 2023

(54) RETRACTABLE DISPLAY ARM

(71) Applicant: Toshiba International Corporation, Houston, TX (US)

(72) Inventor: William McCollum, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 0 days.

(21) Appl. No.: 17/572,294

(22) Filed: Jan. 10, 2022

(65) Prior Publication Data
US 2023/0225073 A1    Jul. 13, 2023

(51) Int. Cl.
*A47B 88/00* (2017.01)
*H05K 7/14* (2006.01)
*F16M 13/02* (2006.01)

(52) U.S. Cl.
CPC ......... *H05K 7/1494* (2013.01); *F16M 13/022* (2013.01)

(58) Field of Classification Search
CPC .......................... H05K 7/1494; F16M 13/022
See application file for complete search history.

(56) References Cited

U.S. PATENT DOCUMENTS

| | | | | |
|---|---|---|---|---|
| 1,360,376 A * | 11/1920 | Douthit | .................. | A47B 67/02 312/227 |
| 2,070,511 A * | 2/1937 | Clements | ................ | F25D 25/00 16/366 |
| 3,981,340 A * | 9/1976 | Anderson | ............... | A47C 31/10 248/324 |
| 5,400,993 A * | 3/1995 | Hamilton | ........... | F16M 11/2014 248/921 |
| 6,647,664 B1 * | 11/2003 | Kochan, Sr. | ............ | E05D 15/28 49/248 |
| 7,077,373 B1 * | 7/2006 | Hoebener | ............... | F16M 11/10 248/316.1 |
| 8,570,723 B2 | 10/2013 | Myerchin | | |
| 8,917,513 B1 * | 12/2014 | Hazzard | ............... | H05K 5/0208 361/826 |
| 9,360,156 B2 * | 6/2016 | Shirley | .................. | F16M 13/02 |
| 9,816,303 B2 * | 11/2017 | Lee | ......................... | E05D 11/06 |
| 2003/0151336 A1 * | 8/2003 | Freeman | ................. | F16M 11/10 312/310 |
| 2016/0330860 A1 * | 11/2016 | Chien | ................. | H05K 7/20736 |
| 2019/0080553 A1 * | 3/2019 | Hohman | ............. | G07F 17/3216 |
| 2021/0099044 A1 | 4/2021 | Campos et al. | | |

* cited by examiner

*Primary Examiner* — Amy J. Sterling
(74) *Attorney, Agent, or Firm* — Baker Botts L.L.P.

(57) ABSTRACT

The systems and methods disclosed are directed towards a retractable and adjustable display arm for a data center cabinet that allows a user to access internal components of the data center cabinet without completely detaching a display from the data center cabinet. The retractable and adjustable display arm has an attachment base to pivotally couple the retractable and adjustable display arm to the data center cabinet, and also has a mounting portion for mounting a display, such as a computer display monitor, tablet, or the like, to the retractable and adjustable display arm. The attachment base achieves the pivotal coupling between the retractable and adjustable display arm to the data center cabinet using one or more hinges. Further, the mounting portion has one or more adjustable supports, allowing displays of varying sizes to be mounted in various locations on the mounting portion.

17 Claims, 6 Drawing Sheets

RETRACTABLE DISPLAY ARM

TECHNICAL FIELD

Embodiments of the present disclosure relate to a support system for a display, more particularly, to a retractable and adjustable display arm for a data center cabinet.

BACKGROUND

Data center cabinets house a variety of interior components, such as server components. In many instances, a data center cabinet further houses a display, such as a touch screen or computer monitor to allow a user to monitor, interact with, or control the interior components. In several configurations, the display is housed in the data center cabinet behind a door of the data center cabinet and in front of the interior components. Further, displays housed within a data center cabinet are often disposed on a mount that is made to fit one particular display size. While these configurations may allow for easy physical access to a securely fastened display, they inhibit physical access to the server components disposed behind the display. Such configurations further prohibit accommodation for varying display sizes.

For example, when a user opens a door to a data center cabinet to add, remove, or adjust a server component located behind a display, the user has to first remove the display, such as by unscrewing the display from a mount in the data center cabinet. The user may also need to remove the mount for the display before accessing the interior components of the data center cabinet. Once the user completes the task for the interior components, the user has to re-mount the display. Such an extensive routine may be burdensome, especially where interior components of such a data center cabinet need to be accessed frequently. The need for an easily movable display system for a data center cabinet is therefore apparent.

Additionally, damage, cost, or advances in technology may prompt users to replace older displays in data center cabinets. Newer displays may have different physical dimensions that do not fit mounts made for older displays. A user would be limited in their selection of displays for data center cabinets. Alternatively, the user would need to purchase a new mount for each new display. The need for an adjustable mount for a display for a data center cabinet is also therefore apparent.

SUMMARY

In accordance with an aspect of the present disclosure, a retractable display arm for a data center cabinet comprises a mounting portion and an attachment base. In accordance with various embodiments of the present disclosure, the mounting portion comprises a top portion, a bottom portion, a proximal end, and a distal end, wherein the proximal and distal ends are each coupled to the top and bottom portions. Further, the mounting portion comprises at least one adjustable support, which may be configured to couple to any of the top or bottom portions, or to the proximal or distal end, or to any combination thereof. In embodiments, the attachment base also comprises a pivotal region to pivotally couple the mounting portion, at the proximal end, to the data center cabinet.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business-related constraints, which will vary from one implementation to another. Moreover, it will be appreciated that such a development effort might be complex and time consuming but would nevertheless be a routine undertaking for those of ordinary skill in the art having the benefit of the present disclosure. Furthermore, in no way should the following examples be read to limit, or define, the scope of the disclosure.

Figure 1:
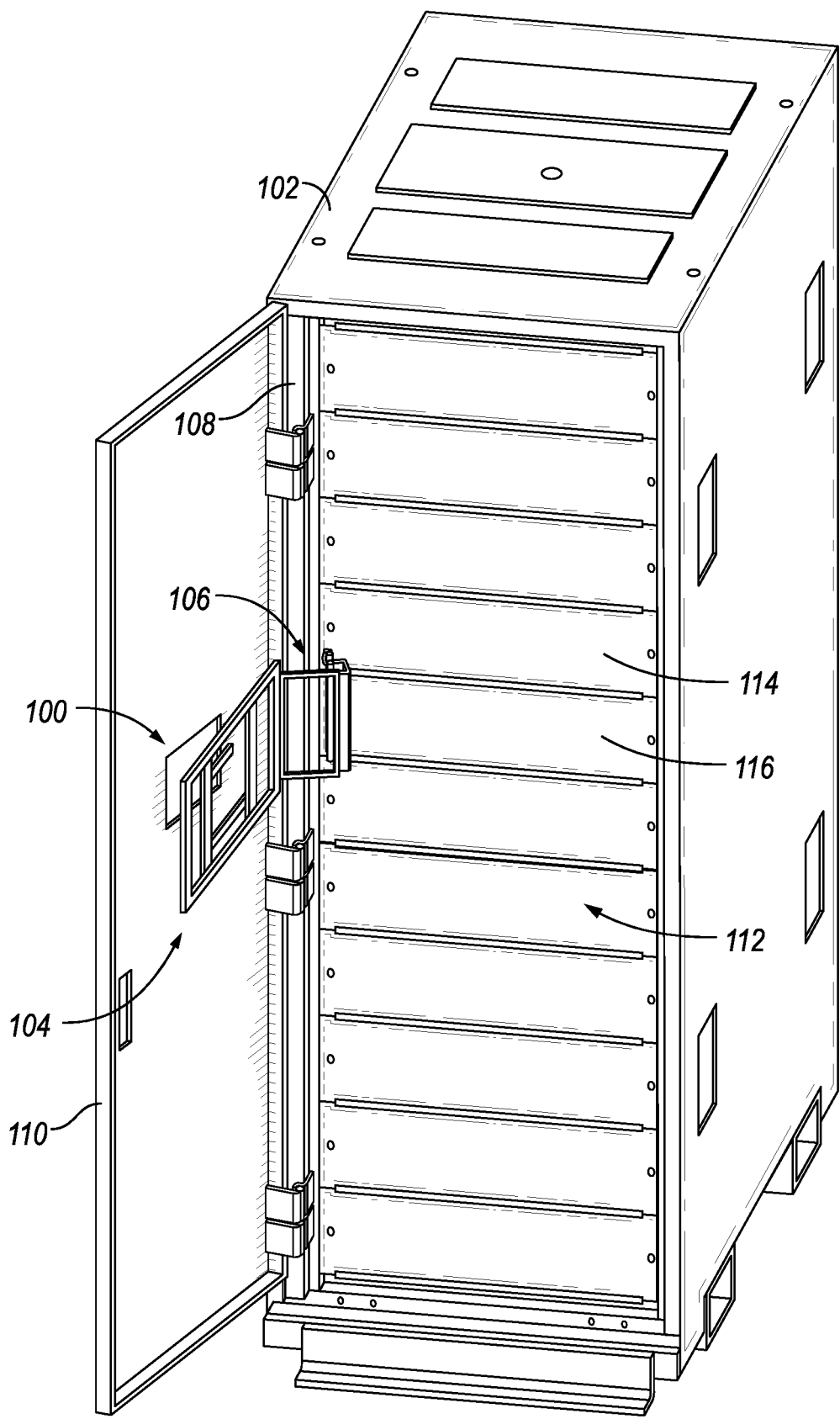
FIG. 1 illustrates a perspective view of a retractable display arm coupled to a data center cabinet.

FIG. 1 illustrates a perspective view of a retractable display arm 100 coupled to a data center cabinet 102, wherein the retractable display arm 100 comprises a mounting portion 104 and an attachment base 106. As shown, the retractable display arm 100 is coupled to a first support beam 108 of the data center cabinet 102 via the attachment base 106. In the embodiment illustrated in FIG. 1, the retractable display arm 100 is in an opened position and is disposed between a door 110 of the data center cabinet 102 and a front face 112 of the data center cabinet 102. In various embodiments, the door 110 may also be coupled to the first support beam 108 of the data center cabinet 102, such that the door 110 and the retractable display arm 100 are both able to extend radially away from the front face 112 of the data center cabinet 102.

In various embodiments, the retractable display arm 100 may be moveable to allow access to interior components of the data center cabinet 102. For example, the data center cabinet 102 illustrated in FIG. 1 is shown to comprise a first interior component 114 and a second interior component 116. The retractable display arm 100 may be able to extend sufficiently away from the front face 112 of the data center cabinet 102 such that the first and second interior components 114, 116 can be accessed without obstruction from the retractable display arm 100.

In embodiments, the retractable display arm 100 may have the same or substantially the same range of motion as the door 110 of the data center cabinet 102. Specifically, the retractable display arm 100 may, when moving to an opened position, be able to radially extend away from the front face 112 of the data center cabinet 102 until it lies flush with the door 110 of the data center cabinet 102. The retractable display arm 100 may also, when moving to a closed position, be able to radially extend towards the front face 112 of the data center cabinet 102 until it lies flush with the front face 112 of the data center cabinet. Further, the retractable display arm 100 may be configured such that when the retractable display arm 100 is in a closed position, the door 110 of the data center cabinet 102 is able to fully close as well. In that embodiment, the retractable display arm 100 may lie flush with both the front face 112 of the data center cabinet 102 and with the door 110 of the data center cabinet simultaneously.

Figure 2:
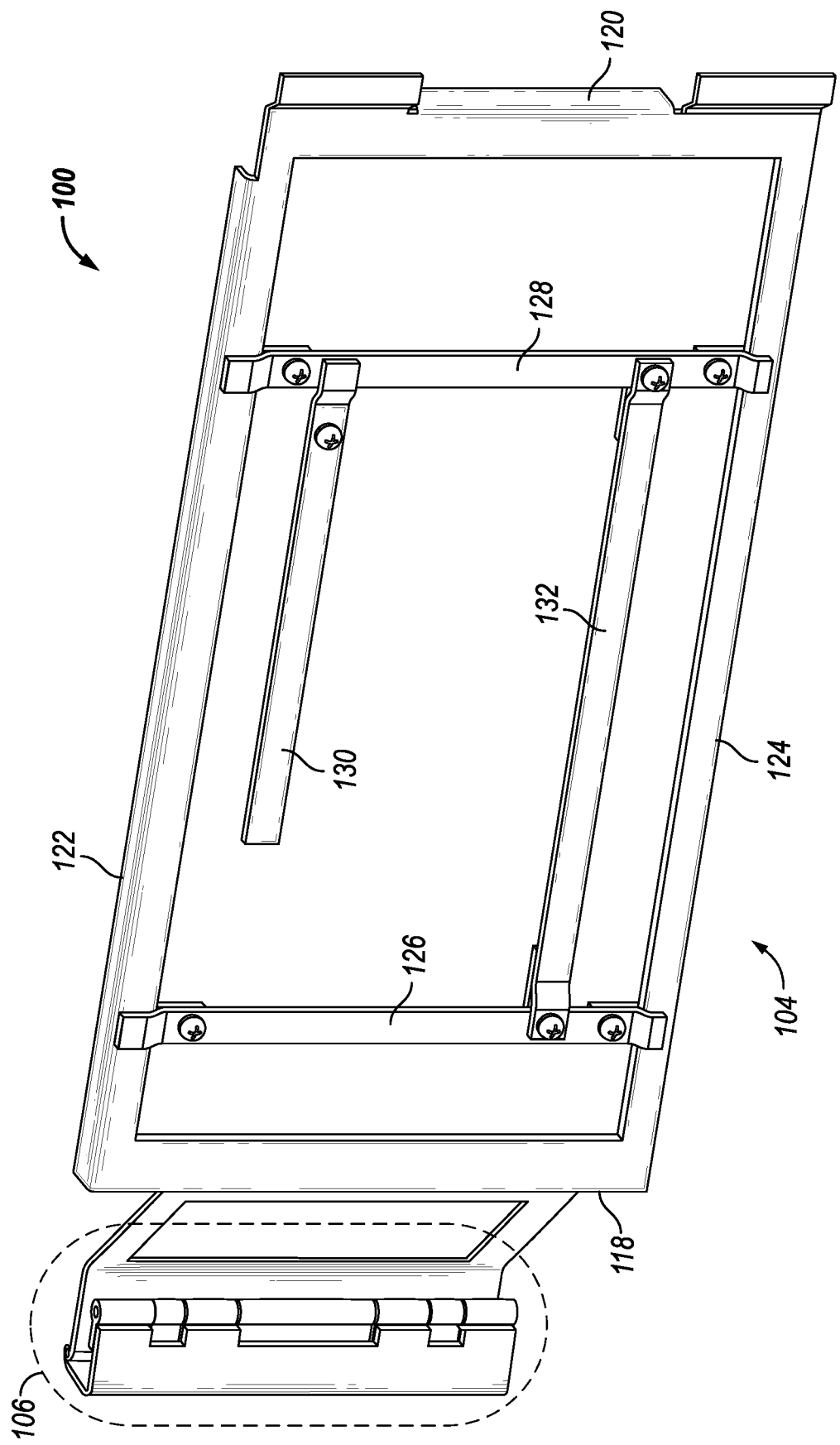
FIG. 2 illustrates a perspective view of a retractable display arm, in accordance with an embodiment of the present disclosure.

With reference now to FIG. 2, a perspective view of the retractable display arm 100 is shown, where the retractable display arm 100 is isolated from the data center cabinet 102 (referring to FIG. 1). As illustrated, the mounting portion 104 is shown to comprise a proximal end 118 and a distal end 120, where the proximal end 118 is coupled to the attachment base 106. The mounting portion 104 is further shown to additionally comprise a top portion 122, a bottom portion 124, a first vertical adjustable support 126, a second vertical adjustable support 128, a first horizontal adjustable support 130, and a second horizontal adjustable support 132.

The first vertical adjustable support 126 is shown to be coupled to both the top and bottom portions 122, 124 of the mounting portion 104. Similarly, the second vertical adjustable support 128 is shown to be coupled to both the top and bottom portions 122, 124 of the mounting portion 104. According to the embodiment of FIG. 2, the first vertical adjustable support 126 is shown to be disposed near the proximal end 118 of the mounting portion 104, while the second vertical adjustable support 128 is shown to be disposed near the distal end 120 of the mounting portion 104. Further, according to the embodiment, the first horizontal adjustable support 130 is shown to be coupled on one side to the second vertical adjustable support 128. In other embodiments, the first horizontal adjustable support 130 may be long enough to be coupled to the first vertical adjustable support 126 on one side and to the second vertical adjustable support 128 on another side. According to FIG. 2, the second horizontal adjustable support 132 is shown to be coupled to the second vertical adjustable support 128 on one side and to the first vertical adjustable support 126 on the other side. According to the embodiment of FIG. 2, the first horizontal adjustable support 130 is shown to be disposed near the top portion 122 of the mounting portion 104, while the second horizontal adjustable support 132 is shown to be disposed near the bottom portion 124 of the mounting portion 104.

According to various embodiments, each adjustable support 126, 128, 130, 132 may be repositioned on or removed from the mounting portion 104 according to the preference of a user. For example, the first vertical adjustable support 126 may be adjusted to be coupled to the top and bottom portions 122, 124 such that it is disposed near a vertical center line of the mounting portion 104. Similarly, by way of another example, the second horizontal adjustable support 132 may be adjusted to be coupled to the first and second vertical adjustable supports 126, 128 such that it is disposed near a horizontal center line of the mounting portion 104. The second vertical adjustable support 128 and the first horizontal adjustable support 130 may be adjusted similarly according to the preference of the user or manufacturer.

The adjustable supports 126, 128, 130, 132 may be adjusted as previously described to allow a display, such as the display 136 of FIGS. 3A and 3B (described below), to be mounted to the mounting portion 104 in varying locations. For example, if each adjustable support 126, 128, 130, 132 were used to mount a display in the position shown in FIG. 2, and a user wished to move the display closer to the distal end 120 of the mounting portion 104, the user may readjust the first and second vertical adjustable support 126, 128 by de-coupling them from the mounting portion 104 and re-coupling them to a location on the mounting portion 104 that is closer to the distal end 120. Similarly, if the adjustable supports 126, 128, 130, 132 were used to mount a display in the position shown in FIG. 2, and a user wished to move the display closer to the top portion 122 of the mounting portion 104, the user may readjust the first and second horizontal adjustable supports 130, 132 by de-coupling them from the first and second vertical adjustable supports 126, 128 and re-coupling them to a location on the first and second vertical adjustable supports 126, 128 that is closer to the top portion 122 of the mounting portion 104.

By similar fashion, the adjustable supports 126, 128, 130, 132 may be adjusted to accommodate displays of varying sizes. For example, the first and second horizontal adjustable supports 130, 132 may each individually be adjusted along the first and second vertical adjustable supports 126, 128 to be closer to or further from the top and bottom portions 122, 124, thereby accommodating displays that vary in height. Similarly, the first and second vertical adjustable supports 126, 128 may each individually be adjusted along the top and bottom portions 122, 124 of the mounting portion 104 to be closer to or further from the proximal and distal ends 118, 120, thereby accommodating displays that vary in width. In the latter case, the first and second horizontal adjustable supports 130, 132 may be replaced with other horizontal adjustable supports that fit to the newly widened or narrowed space between the first and second vertical adjustable supports 126, 128.

In some embodiments, a user or manufacturer may mount a display, such as the display 136 of FIGS. 3A and 3B (described below), to the mounting portion 104 without the need for every adjustable support 126, 128, 130, 132 shown in FIG. 2. For example, a display may be sufficiently supported with only the first and second vertical adjustable supports 126, 128. In such a scenario, the display may be supported on a left side by the first vertical adjustable support 126, on a right side by the second vertical adjustable support 128, and on a bottom side by the bottom portion 124 of the mounting portion 104. Alternatively, if the first and second vertical adjustable supports 126, 128 are adjusted to push tightly against either side of a display by means as screws, brackets, or the like, the first and second vertical adjustable supports 126, 128 may be sufficient to secure the display to the mounting portion 104 without the need of support from the bottom portion 124. In another embodiment, a display may be mounted to the mounting portion 104 by using only one vertical adjustable support, such as the first vertical adjustable support 126. In such a scenario, the display may be supported on a left side by the first vertical adjustable support 126, on the right side by the distal end 120 of the mounting portion 104, and on a bottom side by the bottom portion 124 of the mounting portion 104. Similarly, the display could be supported on the left side by the proximal end 118, on the right side by either the first or second vertical adjustable support 126, 128 respectively, and on the bottom side by the bottom portion 124 of the mounting portion 104.

Figure 3A:
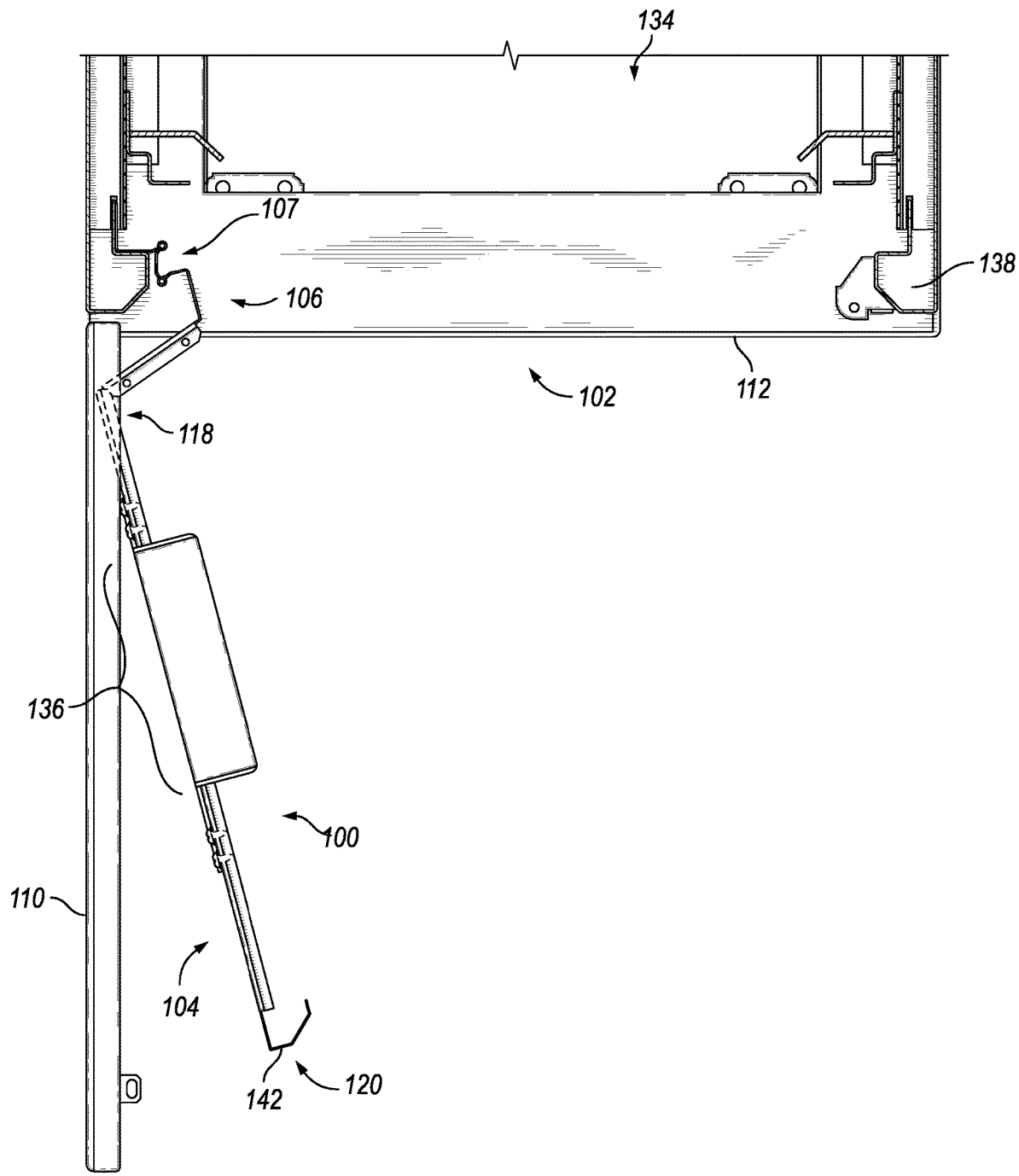
FIG. 3A illustrates an aerial view of a retractable display arm in an opened position, in accordance with an embodiment of the present disclosure.
Figure 4A:
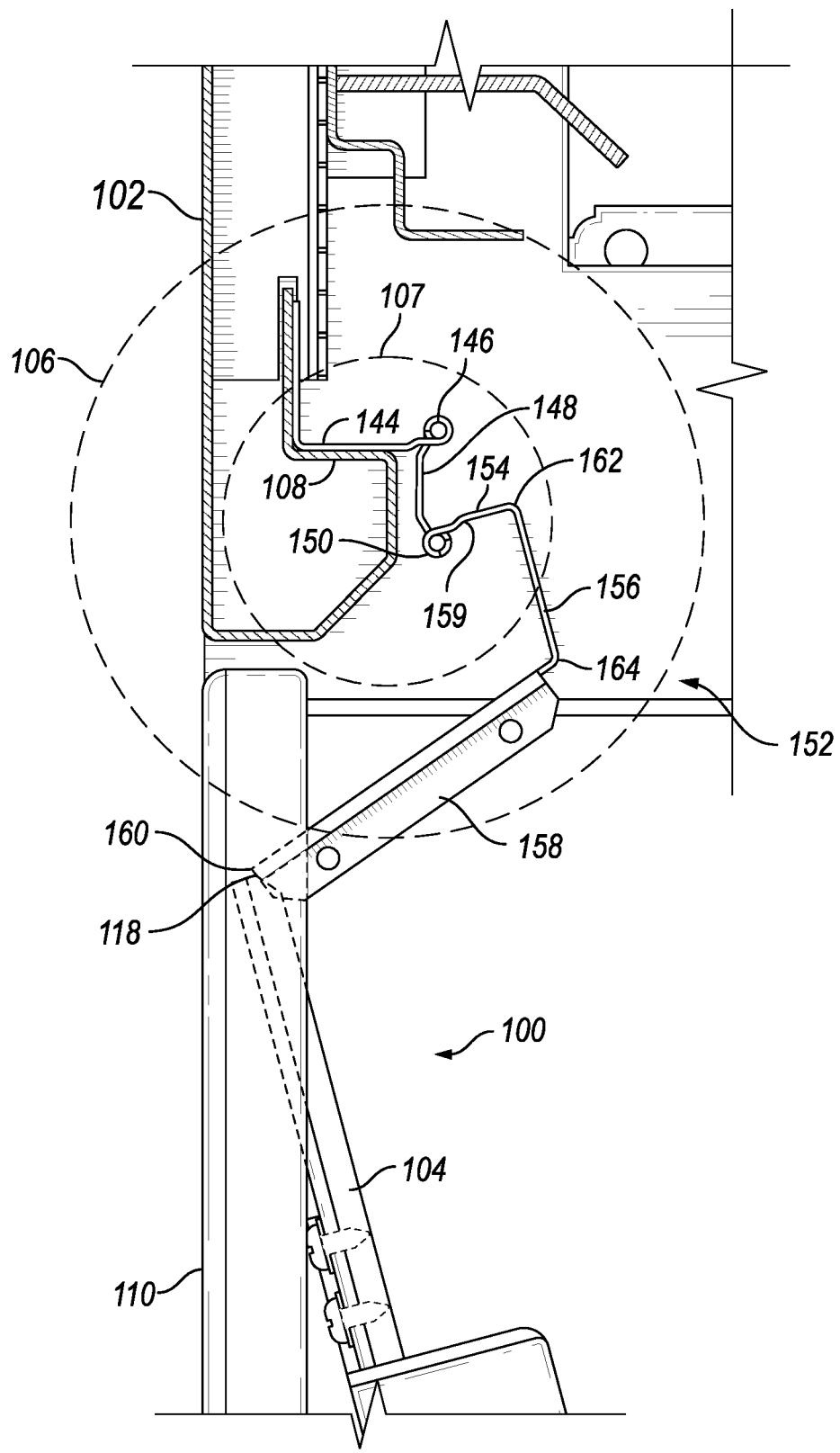
FIG. 4A illustrates a close up aerial view of a portion of the retractable display arm of FIG. 3A, in accordance with an embodiment of the present disclosure.

Turning now to FIG. 3A, an embodiment of a retractable display arm 100 is shown from an aerial perspective, where the retractable display arm 100 is in an opened position. In this embodiment, as in the embodiment of FIG. 1, the retractable display arm 100 may be disposed at the front face 112 of the data center cabinet 102, wherein the retractable display arm 100 is coupled to the data center cabinet 102 via the attachment base 106. The attachment base 106 is further shown to comprise a pivotal region 107. In embodiments, the pivotal region 107 may be configured to pivotally couple the mounting portion 104, at the proximal end 118, to the data center cabinet 102. The pivotal coupling between the attachment base 106 and the proximal end 118 of the mounting portion 104 at the pivotal region 107 may be such that the mounting portion 104 is able to swing radially outward from the front face 112 of the data center cabinet 102. In embodiments, the attachment base 106 may be coupled to a firm structure of the data center cabinet 102 such as a support beam, and may be coupled in a secure fashion such as through screws, adhesive, another attachment mechanism, and any combination thereof. The pivotal coupling at the pivotal region 107 between the attachment base 106 and the proximal end 118 of the mounting portion 104 may be achieved through means such as one or more hinges (e.g., first hinge 146 and second hinge 150 as shown in FIG. 4A).

In various embodiments, the data center cabinet 102 may house internal components, such as server components, in an interior portion 134 of the data center cabinet. When the retractable display arm 100 is in an opened position, a user may be able to access the server components in the interior portion 134 of the data center cabinet 102 without the need to completely detach the retractable display arm 100 from the data center cabinet 102. In embodiments, the retractable display arm 100 may have sufficient range of motion to radially extend up to a position that is substantially flush with the door 110 when both are in an opened position.

Further, a display 136 is shown to be coupled to the mounting portion 104 of the retractable display arm 100. As described for FIG. 2, the display 136 may be disposed on different areas of the mounting portion 104 of the retractable display arm 100. For example, the display 136 may be disposed closer to the proximal end 118 or to the distal end 120 of the mounting portion 104. Further, as described for FIG. 2, the mounting portion 104 may be adjustable to allow displays of varying sizes to be mounted to the retractable display arm 100.

The retractable display arm 100 may further comprise a stopper 142 located at the distal end 120 of the mounting portion 104. The stopper 142 of the retractable display arm 100 may be configured to inhibit inward motion of the retractable display arm 100 when the retractable display arm 100 is in a closed position. Specifically, the stopper 142 may abut a second support beam 138 of the data center cabinet 102 when the retractable display arm 100 is in a closed position, thereby preventing the retractable display arm 100 from swinging inwardly beyond a position that is parallel with the front face 112 of the data center cabinet 102.

Figure 3B:
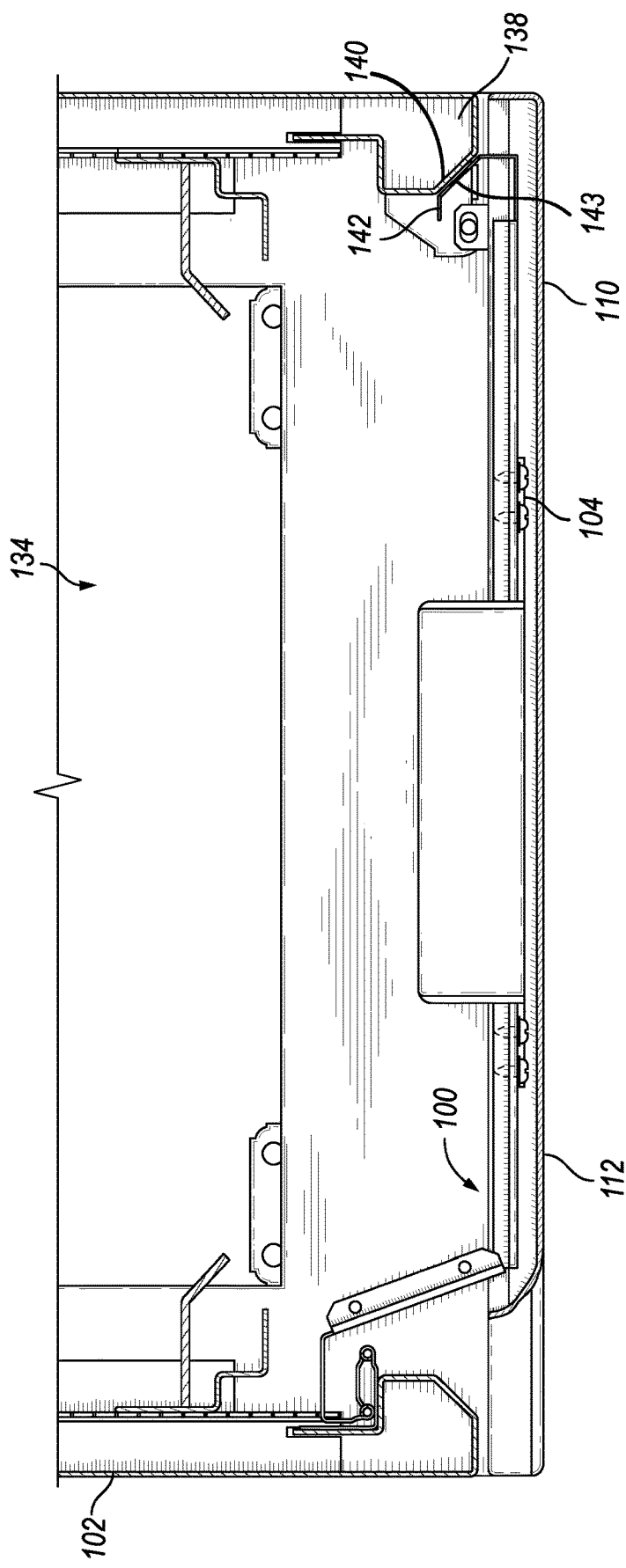
FIG. 3B illustrates an aerial view of a retractable display arm in a closed position, in accordance with an embodiment of the present disclosure.

Referring now to FIG. 3B, another illustration of the retractable display arm 100 from an aerial perspective is shown, where the retractable display arm 100 and the door 110 of the data center cabinet 102 are each in a closed position. According to FIG. 3B, the retractable display arm 100, when in a closed position, may be situated such that the mounting portion 104 lies substantially flush with both the door 110 of the data center cabinet 102 and the front face 112 of the data center cabinet 102. In various embodiments, the retractable display arm 100, when in a closed position, may be configured such that the door 110 of the data center cabinet 102 can close entirely without interference from the retractable display arm 100.

In FIG. 3B, the stopper 142 of the retractable display arm 100 is shown to be aligned with the second support beam 138 of the data center cabinet 102. In various embodiments, a face 143 of the stopper 142 may abut a face 140 of the second support beam 138 when the retractable display arm 100 is in a closed position. In embodiments, a dampening material such as foam or rubber may be coupled to the face 143 of the stopper 142, the face 140 of the second support beam 138, or both. The dampening material may dampen collisions between the retractable display arm 100 and the second support beam 138. Further, dampening material may also be coupled to the mounting portion 104, the door 110 of the data center cabinet 102, or both, such that collisions between the door 110 and the retractable display arm 100 are dampened.

With reference now to FIG. 4A, a close up view of an aerial perspective of the attachment base 106 of FIG. 3A is shown. As illustrated, the attachment base 106 is in an extended position, such that the retractable display arm 100 is in an opened position.

In embodiments, the attachment base 106 may comprise a bracket 144, a pivotal region 107, and a recessed portion 152. The pivotal region 107 may comprise a first hinge 146, a connecting portion 148, and a second hinge 150. In various embodiments, the bracket 144 of the attachment base 106 may be coupled to the first support beam 108 of the data center cabinet 102 in a secure fashion such as through screws, adhesive, another attachment mechanism, or any combination thereof. Further, the first hinge 146 of the pivotal region 107 may be configured to pivotally couple the bracket 144 to the connecting portion 148, and the second hinge 150 may be configured to pivotally couple the connecting portion 148 to the recessed portion 152.

The joint operation of the first and second hinges 146, 150 of the pivotal region may allow the attachment base 106 to dynamically accommodate the first support beam 108 as the retractable display arm 100 opens from the data center cabinet 102, thereby allowing for a wider range of radial motion. Specifically, the first hinge 146 may enable the connecting portion 148 to radially extend from a position substantially parallel to the bracket 144 up to a position adjacent to the first support beam 108 and substantially perpendicular to the bracket 144. Further, the second hinge 150 may enable the recessed portion 152 to radially extend around the connecting portion 148. The first hinge 146 and the second hinge 150 may therefore serve as two pivot points to enable the attachment base 106 to swing the mounting portion 104 into an open position that would be wide enough to allow a user to access the interior portion 134 of the data center cabinet 102.

In various embodiments, the recessed portion 152 may be shaped to allow the mounting portion 104 of the retractable display arm 100 to lie flush with the front face 112 (referring to FIG. 3A) of the data center cabinet 102 when the retractable display arm 100 is in a closed position. Further, the recessed portion 152 may be shaped to allow the retractable display arm 100 to radially extend to up to at least ninety-degrees from the front face 112 of the data center cabinet 102 when the retractable display arm 100 is in an opened position. Similarly, the recessed portion 152 may be shaped to further allow the retractable display arm 100 to lie flush with the door 110 of the data center cabinet 102 when both are in an opened position.

As shown in FIG. 4A, the recessed portion 152 may comprise a first end pivotally 159 coupled to the second hinge 150, and a second end 160 coupled to the proximal end 118 of the mounting portion 104. The recessed portion 152 may further comprise a first leg 154, a second leg 156, and a third leg 158. The first leg 154 may extend from the first end 159 of the recessed portion 152 to a first bend 162. The first bend 162 may be disposed between the first leg 154 and the second leg 156. The second leg 156 may be disposed between the first bend 162 and a second bend 164, wherein the second leg 156 extends from the first bend 162 to the second bend 164. Further, the third leg 158 may be disposed between the second bend 164 and the second end 160 of the recessed portion 152, wherein the third leg 158 extends from the second bend 164 to the second end 160 of the mounting portion 104. In embodiments, some legs may be longer or shorter than others, and each may be disposed at different angles. Further, the recessed portion 152 is not limited to three legs but may comprise more or less than three legs.

In an embodiment, the third leg 158 of the recessed portion 152 may be coupled to the mounting portion 104 at the proximal end 118 in a fixed manner, such that the mounting portion 104 does not radially extend around the recessed portion 152. In an alternate embodiment, the coupling between the third leg 158 of the recessed portion 152 and the mounting portion 104 may be pivotal, such that the mounting portion 104 may radially extend around the recessed portion 152, thereby granting the mounting portion 104 a wider range of motion. In embodiments, pivotal coupling between the third leg 158 of the recessed portion 152 and the mounting portion 104 may be achieved with, for example, a hinge.

Figure 4B:
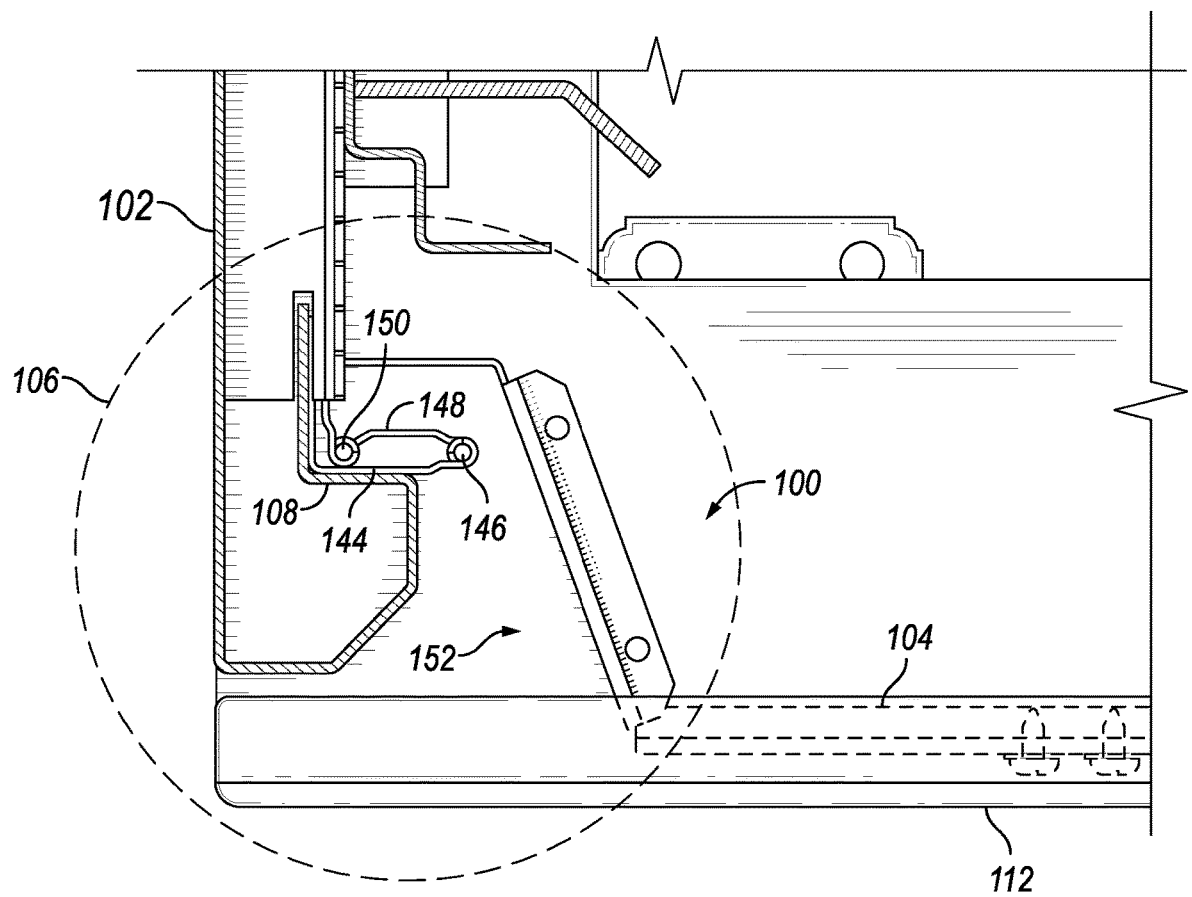
FIG. 4B illustrates a close up aerial view of a portion of the retractable display arm of FIG. 3B, in accordance with an embodiment of the present disclosure.

Turning now to FIG. 4B, a close up aerial view of a portion of the closed retractable display arm 100 of FIG. 3B is shown, where the attachment base 106 is in a retracted position. As in FIG. 4A, the first support beam 108 of the data center cabinet 102, the bracket 144, the first hinge 146, the connecting portion 148, the second hinge 150, and the recessed portion 152 are all shown.

According to FIG. 4B, the connecting portion 148 is shown to be rotated around the first hinge 146 in a counterclockwise fashion relative to the position of the connecting portion 148 in FIG. 4A, such that the connecting portion 148 in FIG. 4B is substantially parallel to the bracket 144. Further, the recessed portion 152 is shown to be rotated around the second hinge 150 in a clockwise fashion relative to the position of the recessed portion 152 in FIG. 4A, such that the recessed portion 152 in FIG. 4B is in a retracted position within the data center cabinet 102. As shown in FIG. 4B, the joint operation of the first hinge 146 and the second hinge 150 may allow the retractable display arm 100 to dynamically accommodate the first support beam 108 as the retractable display arm 100 retracts into the data center cabinet 102, thereby allowing the mounting portion 104 of the retractable display arm 100 to lie substantially flush with the front face 112 of the data center cabinet 102 when in a closed position.

Although the disclosure and its advantages have been described in detail, it should be understood that various changes, substitutions and alterations can be made herein without departing from the spirit and scope of the disclosure as defined by the following claims.

What is claimed is:

1. A retractable display arm for a data center cabinet, comprising:
   a mounting portion operable to house a display, the mounting portion comprising:
      a top portion;
      a bottom portion;
      a proximal end coupled to the top portion and to the bottom portion; and
      a distal end coupled to the top portion and to the bottom portion;
   at least one adjustable support, wherein the adjustable support is configured to couple to any of the top portion, the bottom portion, the proximal end, or the distal end; and
   an attachment base comprising a bracket, a recessed portion, and a pivotal region to pivotally couple the mounting portion to the data center cabinet, wherein the bracket is coupled to a first support beam of the data center cabinet, wherein the pivotal region comprises:
      a first hinge disposed at an end of the bracket;
      a connecting portion coupled to the bracket via the first hinge; and
      a second hinge disposed at an end of the connecting portion opposite to the first hinge,
      wherein a first end of the recessed portion is coupled to the pivotal region via the second hinge, and wherein a second end of the recessed portion is coupled to the mounting portion.

2. The retractable display arm of claim 1,
   wherein the first hinge is configured to pivotally couple the connecting portion to the data center cabinet, and
   wherein the second hinge is configured to pivotally couple the mounting portion, at the proximal end, to the connecting portion.

3. The retractable display arm of claim 1, wherein the recessed portion comprises the first end and the second end,
   wherein the first end of the recessed portion is pivotally coupled to the pivotal region, and wherein the second end of the recessed portion is coupled to the proximal end of the mounting portion.

4. The retractable display arm of claim 3, wherein the recessed portion further comprises:
   a first leg coupled to the pivotal region;
   a second leg coupled to the first leg at a first bend; and
   a third leg coupled to the second leg at a second bend;
   wherein the mounting portion is coupled to the third leg at the proximal end.

5. The retractable display arm of claim 1, wherein the mounting portion further comprises:
   a first vertical adjustable support and a second vertical adjustable support; and
   a first horizontal adjustable support and a second horizontal adjustable support;
   wherein the first vertical adjustable support and the second vertical adjustable support are configured to couple to any of the top portion, the bottom portion, the first horizontal adjustable support, or the second horizontal adjustable support, and
   wherein the first horizontal adjustable support and the second horizontal adjustable support are configured to couple to any of the proximal end, the distal end, the first vertical adjustable support, or the second vertical adjustable support.

6. The retractable display arm of claim 1, wherein the mounting portion further comprises a stopper at the distal end, wherein the stopper is configured to abut a portion of the data center cabinet when the retractable display arm is in a closed position.

7. A system for data storage, comprising:
a data center cabinet, comprising at least one interior component and a first support beam;
a door coupled to the first support beam and operable to pivot about the first support beam; and
a retractable display arm coupled to the first support beam, the retractable display arm being disposed between the door and a front face of the data center cabinet, the retractable display arm comprising:
a mounting portion operable to house a display, the mounting portion comprising:
a top portion;
a bottom portion;
a proximal end coupled to the top portion and to the bottom portion; and
a distal end coupled to the top portion and to the bottom portion;
at least one adjustable support, wherein the adjustable support is configured to couple to any of the top portion, the bottom portion, the proximal end, or the distal end; and
an attachment base comprising a pivotal region to pivotally couple the mounting portion, at the proximal end, to the data center cabinet.

8. The system of claim 7, wherein the pivotal region comprises:
a first hinge;
a second hinge; and
a connecting portion,
wherein the first hinge is configured to pivotally couple the connecting portion to the data center cabinet, and
wherein the second hinge is configured to pivotally couple the mounting portion, at the proximal end, to the connecting portion.

9. The system of claim 7, wherein the attachment base further comprises:
a recessed portion comprising a first end and a second end,
wherein the first end of the recessed portion is pivotally coupled to the pivotal region, and wherein the second end of the recessed portion is coupled to the proximal end of the mounting portion.

10. The system of claim 9, wherein the recessed portion comprises:
a first leg coupled to the pivotal region;
a second leg coupled to the first leg at a first bend; and
a third leg coupled to the second leg at a second bend;
wherein the mounting portion is coupled to the third leg at the proximal end.

11. The system of claim 7, wherein the mounting portion further comprises:
a first vertical adjustable support and a second vertical adjustable support; and
a first horizontal adjustable support and a second horizontal adjustable support;
wherein the first vertical adjustable support and the second vertical adjustable support are configured to couple to any of the top portion, the bottom portion, the first horizontal adjustable support, or the second horizontal adjustable support, and
wherein the first horizontal adjustable support and the second horizontal adjustable support are configured to couple to any of the proximal end, the distal end, the first vertical adjustable support, or the second vertical adjustable support.

12. The system of claim 7, wherein the mounting portion further comprises a stopper at the distal end, wherein the stopper is configured to abut a portion of the data center cabinet when the retractable display arm is in a closed position.

13. A method of operating a retractable display arm of a data center cabinet, comprising:
translating a door of the data center cabinet from a closed position to an opened position; and
translating the retractable display arm from a closed position to an opened position, wherein translating the retractable display arm comprises extending an attachment base of the retractable display arm from a retracted position to an extended position, wherein the attachment base comprises a bracket, a recessed portion, and a pivotal region, wherein the bracket is coupled to a first support beam of the data center cabinet, wherein the pivotal region comprises:
a first hinge disposed at an end of the bracket;
a connecting portion coupled to the bracket via the first hinge; and
a second hinge disposed at an end of the connecting portion opposite to the first hinge,
wherein a first end of the recessed portion is coupled to the pivotal region via the second hinge, and wherein a second end of the recessed portion is coupled to the mounting portion, and
wherein in the closed position, the connecting portion is substantially parallel to the bracket.

14. The method of claim 13, further comprising:
rotating the recessed portion of the retractable display arm about the pivotal region of the attachment base.

15. The method of claim 13, wherein the door is coupled to the first support beam and operable to pivot about the first support beam, wherein the retractable display arm is disposed between the door and a front face of the data center cabinet.

16. The method of claim 13, wherein extending the attachment base from the retracted position to the extended position comprises:
rotating the connecting portion about the first hinge; and
rotating the recessed portion about the second hinge;
wherein the connecting portion couples the first hinge to the second hinge, and wherein the second hinge couples the connecting portion to the recessed portion.

17. The method of claim 13,
wherein translating the retractable display arm from the closed position to the opened position further comprises:
extending a mounting portion of the retractable display arm radially away from a front face of the data center cabinet.

* * * * *